US006626264B1

(12) United States Patent
Christen (10) Patent No.: US 6,626,264 B1
(45) Date of Patent: Sep. 30, 2003

(54) RADIO FREQUENCY SHIELDED AND ACOUSTICALLY INSULATED ENCLOSURE

(75) Inventor: Walter J. Christen, Wettingen (CH)

(73) Assignee: IGT, Reno, NV (US)

( * ) Notice: Subject to any disclaimer, the term of this patent is extended or adjusted under 35 U.S.C. 154(b) by 0 days.

(21) Appl. No.: 10/000,109

(22) Filed: Oct. 30, 2001

(51) Int. Cl.$^7$ .............................................. H05K 9/00
(52) U.S. Cl. .................. 181/290; 174/35 MS; 52/79.1; 455/300
(58) Field of Search ................. 174/35 MS; 455/300; 181/290, 285, 294, 295, 284; 52/79.1

(56) References Cited

U.S. PATENT DOCUMENTS

| 1,789,827 A | 1/1931 | McKay |
| 2,440,763 A | 5/1948 | Todhunter |
| 3,557,777 A | 1/1971 | Cohen |
| 4,370,831 A | 2/1983 | Hamilton |

(List continued on next page.)

OTHER PUBLICATIONS

Magnetically shielded rooms in diagnostics and semi–conductor technology written by Karl–Jürgen Best, Jochen Bork, published Edition 2/91.
Noise Reduction and Sound Attention Properties (website) written by www.steelceilings.com, printed Oct. 24, 2001.
Guymark®UK (website) written by www.guymark.com, printed Oct. 24, 2001.
Shielding Insights (website) written by www.lindgrenrf.com, printed Jan. 30, 2002.
Shielding Insights (website) written by www.lindgrenrf.com, printed Jan. 30, 2002.
Shielding Insights (newsletter) written by Lindgreen RF Enclosures, Inc., published 1999.

(List continued on next page.)

*Primary Examiner*—Robert E. Nappi
*Assistant Examiner*—David Warren
(74) *Attorney, Agent, or Firm*—Bell, Boyd & Lloyd LLC (57) ABSTRACT

The present invention provides a radio frequency ("RF") shielded and acoustically isolated enclosure that efficiently employs multiple layers of sound insulation and absorbs airborne noise and the noise provided by magnetic resonance imaging ("MRI") equipment through the supports of such equipment. The RF enclosure uses multiple layers and types of insulating materials positioned to maximize the noise absorption of the RF enclosure. This reduces the cost and space required by the enclosure. In one embodiment the enclosure includes a ceiling, a floor and a plurality of walls. The ceiling and walls include one or more multiple layers of different indulating materials that either abut each other or form air gaps. In one embodiment the floor includes a heavy metal plate on which the MRI equipment sits. The plate elastically couples to a conductive shield. The elastic coupling attenuates certain frequencies above the natural frequency of the metal sheet.

33 Claims, 6 Drawing Sheets

U.S. PATENT DOCUMENTS

| | | |
|---|---|---|
| 4,507,520 A | 3/1985 | Lindgren |
| 4,561,209 A | 12/1985 | Sohlström |
| 4,613,820 A | 9/1986 | Edelstein et al. |
| 4,642,416 A | 2/1987 | Rogner |
| 4,651,099 A | 3/1987 | Vinegar et al. |
| 4,691,483 A | 9/1987 | Anderson |
| 4,742,107 A | 5/1988 | Statz |
| 4,755,630 A | 7/1988 | Smith et al. |
| 4,786,758 A | 11/1988 | Zielinski |
| 4,794,206 A | 12/1988 | Weinstein |
| 4,889,124 A | 12/1989 | Schneider |
| 4,894,489 A | 1/1990 | Takahashi et al. |
| 4,910,920 A | 3/1990 | Nichols |
| 4,929,802 A | 5/1990 | Schaepers et al. |
| 4,932,180 A | 6/1990 | Takahashi et al. |
| RE33,256 E | 7/1990 | Busby |
| 4,941,207 A | 7/1990 | Maeda et al. |
| 4,953,324 A | 9/1990 | Herrmann |
| 4,959,504 A | 9/1990 | Yarger et al. |
| 4,982,053 A | 1/1991 | Thornley et al. |
| 5,013,869 A | 5/1991 | Breithaupt |
| 5,017,736 A | 5/1991 | Yarger et al. |
| 5,043,529 A | 8/1991 | Vanesky et al. |
| 5,045,636 A | 9/1991 | Johnasen et al. |
| 5,063,273 A | 11/1991 | Bloks |
| 5,081,071 A | 1/1992 | Hirschkoff |
| 5,120,087 A | 6/1992 | Pastva |
| 5,167,098 A | 12/1992 | Blackwelder |
| 5,197,225 A | 3/1993 | Yff |
| 5,223,670 A | 6/1993 | Hogan et al. |
| 5,241,132 A | 8/1993 | McCormack |
| 5,335,464 A | 8/1994 | Vanesky et al. |
| 5,371,987 A | 12/1994 | Hirsch et al. |
| 5,452,550 A | 9/1995 | Vanesky et al. |
| 5,510,575 A | 4/1996 | Weibler |
| 5,544,452 A | 8/1996 | Fujita et al. |
| 5,569,878 A | 10/1996 | Zielinski |
| 5,583,318 A | 12/1996 | Powell |
| 5,595,801 A | 1/1997 | Fahy et al. |
| 5,603,196 A | 2/1997 | Sohlström |
| 5,613,330 A | 3/1997 | Peräläet al. |
| 5,736,671 A | 4/1998 | Peräläet al. |
| 5,749,178 A | 5/1998 | Garmong |
| 5,755,062 A | 5/1998 | Slater |
| 5,777,279 A | 7/1998 | Parker et al. |
| 5,786,547 A | 7/1998 | Zielinski |
| 5,908,043 A | 6/1999 | Paes et al. |
| 6,085,865 A | 7/2000 | Delverdier et al. |
| 6,170,203 B1 | 1/2001 | Schlapfer |
| 6,282,848 B1 | 9/2001 | Schlapfer |

OTHER PUBLICATIONS

IMEDCO Protective Shielding for MRI Equipment Brochure written by Imedco, published prior to Oct. 30, 2001.

IMEDCO Custom RF Window Options written by Imedco, published prior to Oct. 30, 2001.

PRB Gyroscan written by Philips Medical Systems, published in 2000.

Heavily Magnetically Shielded Room For Measurements of Extremely Weak Magnetic Fields, written by A. Mager, L. Borek, published prior to Oct. 30, 2001.

Superconducting Shield For Biomagnetism Measurement Coupled With Ferro–Magnetic written by H. Matsuba, D. Irisawa, A. Yahara, published prior to Oct. 30, 2001.

A Two–Shell Magnetically Shielded Room For Magnetophysiology written by Y. Okada, B. Shah, published prior to Oct. 30, 2001.

High Tc Superconducting Magnetic Shields For Biomagnetic Applications written by Y. Shimbo, K. Nakada, K. Niki, M. Kabasawa, Y. Uchikawa, M. Kotani, published prior to Oct. 30, 2001.

A Clinically Oriented Shielded Facility For Biomagnetism written R.J.P. Bain, G.B. Donaldson, C.M. Pegrum, P. Maas, A.I. Weir, published prior to Oct. 30, 2001.

Designing and Inspecting System of Prefabricated Magnetically Shielded Room For Biomagnetism written by K. Okuda, J. Takeuchi, M. Mukai, S. Kuriki, Y. Uchikawa, M. Kotani, published prior to Oct. 30, 2001.

Shielding Factor of the Box–Shaped MSR for SQUID Measurement written by N. Ishikawa, N. Kasai, H. Kado, published prior to Oct. 30, 2001.

Magnetically Shielded Rooms for Biomagnetic Investigations written by Vacuumschmelze GmbH, published prior to Oct. 30, 2001.

Understanding Shielding written by James. P. Antonic, published prior to Oct. 30, 2001.

Design, Construction, and Performance of a Large–Volume Magnetic Shield written by Vaino O. Kelha, Jussi M. Pukki, Risto S. Peltonen, Auvo J. Penttinen, Risto J. Ilmonimi, and Jarmo J. Heino, published Jan. 1982.

RADIO FREQUENCY SHIELDED AND ACOUSTICALLY INSULATED ENCLOSURE

CROSS REFERENCE TO RELATED APPLICATION

The application is related to the following co-pending commonly-owned patent application: "A Radio Frequency Shielded and Acoustically Insulated Door," Ser. No. 09/702,454.

BACKGROUND OF THE INVENTION

The present invention relates in general to insulated enclosures and more particularly to radio frequency shielded and acoustically insulated enclosures.

The power of magnetic resonance imaging ("MRI") equipment is continually increasing to meet the demand in the medical community for better and faster developing images. However, as the power of MRI equipment increases, an increased amount of noise is generated due, in part, to the coil assembly of the MRI equipment. MRI acoustic noise is mainly caused by Lorentz forces acting on the gradient coils of the MRI equipment. As the gradient current switches direction, the gradient windings vibrate in their mountings, leading to the emission of sound waves. The frequency range for such sound waves for certain MRI equipment may be 10 Hz–20 kHz. MRI equipment therefore generates substantial noise, possibly at different frequencies, which travels from the MRI equipment toward the walls, floor and ceiling of the enclosure in which the MRI equipment resides. The MRI equipment transmits noise: (i) through the air to the walls, ceiling and floor of the enclosure; and (ii) through the supports of the MRI equipment to the floor, walls and ceiling of the enclosure.

As a result, the level of noise may at times exceed health and safety regulatory and industry standards, which seek to protect the operator of the MRI equipment (and others in the surrounding areas adjacent to such rooms or enclosures) from potentially dangerous noise levels. Such MRI equipment must therefore be properly contained within a radio frequency ("RF") shielded and sufficiently acoustically insulated room to protect the MRI equipment from stray electromagnetic radiation and to protect the operators (and others) from continuous, excessive and undesired noise levels.

To absorb the airborne noises in an RF room or enclosure, manufacturers have employed multiple layers of an insulating material in the walls, ceiling and floor of the enclosure to absorb noise up to a particular decibel level. Generally, adding additional layers or thickening existing layers of the insulating material in the enclosure increases the noise absorption characteristics of the enclosure. Although the addition of the extra layers or extra thickness of the insulating materials increases noise absorption of the enclosure, this method of increasing noise attenuation eventually diminishes in efficiency. That is, as additional layers of the insulation are added, the level of noise absorption reaches a plateau, whereby adding additional layers of the insulating material to the enclosure will not overcome the plateau.

For example, a known type of sound insulation is chipboard or particleboard core sheet. It is also known that 50 mm of a certain type of particleboard provides 28 decibels (dB's) of attenuation. 60 mm of the same type of particleboard provides 29 decibels (dB's) of attenuation. 80 mm of the same type of particleboard provides 32 decibels (dB's) of attenuation, etc. As illustrated, the change in attenuation lessens as the particleboard thickens.

Adding layers of insulation or thickening layers begins to take up substantial space and adds to the cost and weight of the enclosure. Therefore, simply adding extra layers of the insulating material or thickening the existing layers increases the cost of the enclosure without maximizing the noise absorption capability of the enclosure.

To better absorb airborne noises from MRI equipment, there is a need for an RF shielded and acoustically insulated enclosure which attenuates RF fields and absorbs increased levels of noise in an efficient, cost effective and spatially acceptable manner.

Additionally, the MRI equipment presents a related noise and vibration problem because the MRI equipment transmits vibration and noise through the supporting floor. The floor below the MRI equipment must therefore support the weight of the magnet present in the MRI equipment and the vibration generated by the MRI equipment. Simply providing layers of sound insulation does not effectively prevent the vibration and related noise from traveling from the equipment through such supports, to the I-beams and other support structures that separate one room from another and one floor from another in the building which houses the RF enclosure. Accordingly, there is a need for an RF shielded and acoustically insulated enclosure that absorbs the vibration and related noise generated by the MRI equipment.

SUMMARY OF THE INVENTION

The present invention provides an RF shielded and acoustically insulated enclosure that efficiently employs multiple layers of sound insulation having different noise absorption characteristics to absorb airborne noise and vibrational noise generated by the MRI equipment. The RF enclosure of the present invention provides multiple layers and multiple types of insulating materials positioned in the walls, ceiling and floor of the enclosure to maximize the noise absorption of the RF enclosure and specifically to maximize the noise absorption effect of each such insulating layer while minimizing the number and size of the insulating layers. The efficient use of the multiple insulating layers reduces the cost of and space required by the RF enclosure. In one embodiment of the present invention, the RF enclosure includes a ceiling, a floor and a plurality of walls. The ceiling and walls include multiple layers of different insulating materials having different noise absorption characteristics that either abut each other or are spaced apart to define or form air gaps therebetween. In one embodiment further discussed below, the floor includes a non-magnetic weighted support such as a relatively heavy stainless steel plate on which the MRI equipment rests. The stainless steel plate is supported by at least one and preferably a plurality of elastomeric vibration dampening members which absorb the vibration of the weighted support. The elastomeric members rest on or above the conductive shield. The elastomeric members are thus adapted to absorb the vibration and related noise of the MRI equipment.

In certain buildings where RF enclosures are constructed, the building walls are designed and built to provide minimum levels of soundproofing. In one embodiment of the present invention, at least one of the walls of the enclosure co-acts with at least one of the walls of the building to provide noise absorption. That is, the enclosure is positioned adjacent to one or more walls of the building in which the enclosure resides. One or more layers of sound insulating material of the enclosure co-act with or are alternatively inserted into one or more walls of the building to increase the overall performance of the enclosure.

More specifically, in one embodiment, the enclosure includes a frame. The walls of the frame form cavities. These cavities in one embodiment are filled with sound insulation. To provide RF shielding, the outside of the frame (including the insulation filled cavities) includes a sheet of copper shielding. The insulated and shielded frame is adjacent to one or more insulated building walls. One or more additional layers of sound insulation is placed between the frame and the building walls before the frame is secured to the building.

It should be appreciated that the above described wall of the present invention thus provides different opportunities or positions to install various layers of sound insulation such as: (i) in the frame; (ii) in the building wall; and (iii) between the frame and the building wall. The amount of insulation needed generally depends on two factors: (i) the level of sound absorption necessary or desired; and (ii) the level of sound absorption provided by the walls of the building, without the enclosure. In a preferred embodiment, different types of insulation having different noise absorption characteristics are used. For instance, a finishing layer or barrier, such as a drywall, resides on the inside of the frame and has certain noise insulating characteristics. The insulation inside the cavities of the frame in one embodiment is heavy Rockwool or mineral wool, which has a different noise absorption characteristic than does the drywall.

In a preferred embodiment, the present invention includes one or more air gaps. The air gaps function to trap and disperse the sound waves that have traveled through previous interior layers of insulation. The air gaps may exist between any two layers of similar or different insulation. For example, in one embodiment, an air gap exists between the finishing barrier and the frame. In another embodiment, the layers of insulation between the frame and building wall define one or more air gaps. Further, in another embodiment, the multiple layers of insulation placed in the building wall define one or more air gaps.

In one embodiment, the ceiling of the enclosure generally employs the same materials and methodology as the walls of the present invention. That is, the ceiling includes a frame having an RF shield such as a copper shield and a finishing barrier or wall beneath the frame that meets or abuts the finishing barriers of the walls of the enclosure. The patients and equipment operators therefore only see the finishing barriers, e.g., the drywall, and the remainder of the soundproofing remains hidden from view. In one embodiment, the ceiling of the enclosure is integrated with a ceiling member of the building to take advantage of the building's inherent soundproofing.

A relatively substantial space may extend between the ceiling and the RF shielded frame to enable one or more additional frames to be positioned between the enclosure frame and the ceiling of the building or a floor of the building. The additional frames can support lighting, electrical conduit, etc., as well as provide support for additional layers of insulation. The ceiling, like the walls of the enclosure, provides multiple areas or opportunities for one or more air gaps.

The floor of the enclosure rests on the base of the building or a floor of the building such as a concrete substrate. In one embodiment, the floor of the enclosure includes a layer of electrical insulation which rests on the concrete substrate. A layer of hard insulation such as hard fiberboard or masonite is positioned on top of the layer of electrical insulation. An RF shield or copper shield is positioned on top of the hard layer of insulation. In one embodiment, as indicated above, a non-magnetic weighted support or plate is positioned in the portion of the floor of the enclosure that supports the noise producing equipment.

The non-magnetic weighted support or plate rests on one or more elastomeric vibration dampening members such as elongated elastic strips, which in turn rest on the RF shielding. The elastomeric members and the non-magnetic weighted support or plate co-act to dampen the vibration and related noise created by the MRI equipment. The remainder of the floor is built up around the elastomeric members and the non-magnetic weighted plate. One or more additional layers of sound insulation such as chipboard or particleboard core, extend around the plate. A continuous layer of floor covering rests on the insulation around the plate. A separate layer of the floor covering can also attach to the plate. The top of the insulation around the plate in a preferred embodiment sits flush with the top of the non-magnetic weighted support or plate. In other embodiments, the plate is slightly above or below the surrounding insulation.

It is therefore an advantage of the present invention to provide an RF shielded and acoustically insulated enclosure that efficiently employs multiple layers of insulation to absorb noise.

Another advantage of the present invention is to provide an RF shielded and acoustically insulated enclosure that absorbs the vibration and related noise generated by the MRI equipment through the supports of such equipment.

A further advantage of the present invention is to provide a self-contained RF shielded and acoustically insulated enclosure.

Still another advantage of the present invention is to provide an RF shielded and acoustically insulated enclosure that conforms to a building's electrical and structural codes.

Still a further advantage of the present invention is to provide an RF shielded and acoustically insulated enclosure that is integrated with the walls, ceilings and floors of an existing building.

Yet another advantage of the present invention is to provide an RF shielded and acoustically insulated enclosure adapted to provide minimum levels of noise absorption.

Yet a further advantage of the present invention is to provide an RF shielded and acoustically insulated enclosure adapted to the sound characteristics of an existing building.

Additional features and advantages of the present invention are described in, and will be apparent from, the following Detailed Description of the Invention and the figures.

DETAILED DESCRIPTION

Figure 1:
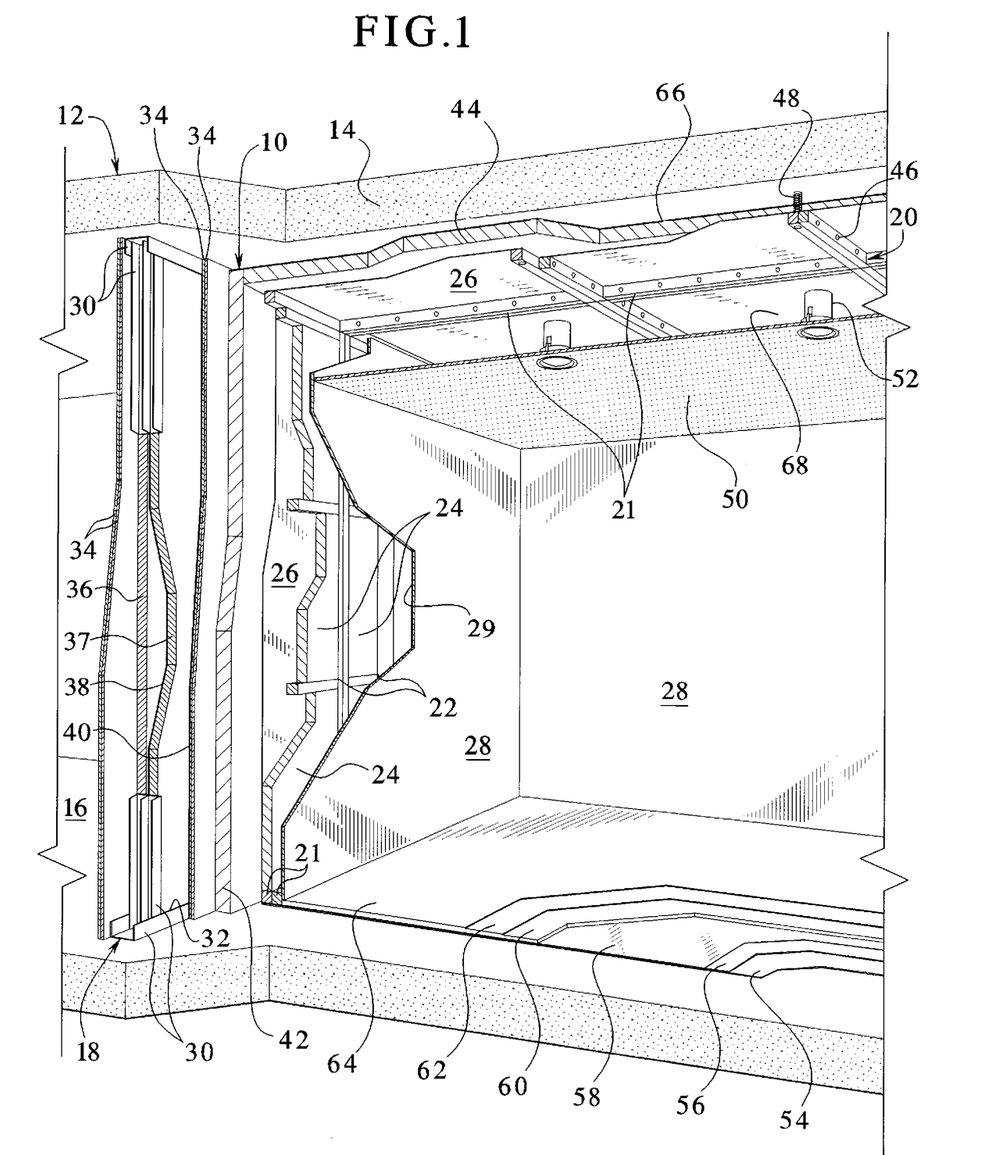
FIG. 1 is a fragmentary perspective view of one embodiment of an acoustically insulated and RF shielded enclosure of the present invention.

Referring now to the drawings and in particular to FIG. 1, one embodiment of the acoustically insulated and RF shielded enclosure 10 of the present invention is illustrated. The enclosure 10 resides within a building 12. The building 12 includes a ceiling 14, a floor 16 and a plurality of walls 18 connected to the floor and which support the ceiling. This embodiment of the enclosure 10 utilizes one or more of the walls 18 as an outer barrier of the enclosure, as described below.

The enclosure 10 includes a framework 20. The framework 20 in one embodiment is wooden, but may alternatively be constructed of light metal, hard plastic or any other suitable material. The framework 20 defines the top and sides of the enclosure 10. The framework 20 includes a plurality of legs or struts 21 bolted, glued or otherwise suitably fastened together. As illustrated, the framework 20 may have two or more legs side by side.

The framework 20 defines a plurality of cavities 22. The cavities 22 are generally the open spaces extending between the legs or struts 21. The cavities 22 of the enclosure 10 may be filled with one or more layers of sound wave insulation 24 or may be left as air gaps. In one embodiment, the layer(s) of sound insulation 24 is mineral wool. The mineral wool, for example, may be Rockwool having a desired density. In one embodiment, the desired density of the Rockwool is 32 kg/m³. In one embodiment, the mineral wool 24 has a longitudinal sound conductivity resistance of at least 10 kP s/m². The air gap and sound insulation layers accordingly have different sound wave absorbing characteristics.

A sheet of RF or copper shielding 26 is mounted to the exterior of the framework 20. That is, the RF shielding 26 is mounted to the exterior of the wood legs or struts 21 and the sound wave insulation 24, if any. The RF shielding is also incorporated into the floor as described in more detail below. The result is an enclosure having the framework 20 and copper shielding 26 on all faces or sides. This creates what is known as a Faraday cage. The Faraday cage applies metal screening to prevent the propagation of radio frequency electromagnetic waves into the enclosure. The RF shielding is preferably copper. Copper is especially suitable for shielded enclosures because, in contrast to other metals, oxidized copper is also electrically conductive.

A finishing wall 28 preferably resides on the interior of the framework 20. The finishing wall 28 in one embodiment is drywall which may be painted or otherwise suitably aesthetically coated. The finishing wall 28 can alternatively be particleboard, plywood, a layer of laminated or coated chipboard or plasterboard with a wallpaper finish. The finishing wall 28 also provides sound insulation, attenuation or absorption. It should be appreciated that the finishing wall 28 is preferably formed from a different material having different sound absorption characteristics than the sound insulation 24 filling the cavities 22 of the framework 20. The enclosure 10 of the present invention therefore includes multiple types of sound insulation each having at least one different sound absorption characteristic.

In one embodiment, framework 20 and the finishing wall 28 define an air gap 29. That is, there is a space or gap extending between the framework 20 and the finishing wall 28. Sound waves that travel through the finishing wall 28 tend to follow the path of least resistance and scatter or disperse throughout the air gap 29 before attempting to penetrate through the framework 20 and the sound wave insulation 24. In this way, the air gap 29 removes or dissipates some of the energy or potential that the sound waves have of further penetrating through the other subsequent or exterior layers of insulation having different sound absorption characteristics.

In one embodiment, a second frame 30 is positioned between a plurality of insulating layers illustrated in the form of a plurality of stacked or adjacent plasterboard sheets 34 of the building wall 18. The second frame 30 in one embodiment is also a part of the building 12 that is constructed separately from the construction of the rest of the enclosure 10. The enclosure 10 utilizes the available space provided by the second frame 30. As with the framework 20, the second frame 30 defines one or more cavities 32. The plasterboard sheets 34 surround both sides of the frame 30 and its one or more cavities 32. The plasterboard sheets 34 define the thickness and size of the wall 18 of the building 12.

As illustrated, the enclosure 10 includes two plasterboard sheets 34 on either side of the frame 30. Certain buildings may have walls having multiple layers of plasterboard 34. Alternatively, an additional one or more layers 34 may be added when the enclosure 10 is installed. It should be appreciated that the plasterboard sheets 34 also provide sound insulation having a different sound absorption characteristic. Therefore, in one embodiment the wall of the enclosure 10 includes at least three different types of sound insulation having three different sound absorption characteristics.

The cavity 32 of the frame 30 as well as the cavities 22 of the framework 20 may be left as air gaps. Alternatively, the cavity 32 as illustrated in FIG. 1 is filled by one or more pieces of sound wave insulation as described above. As illustrated, in one embodiment mineral wool sheets 36 and 37 reside within the cavity 32. The mineral wool sheets 36 and 37 again may be Rockwool having a specified density and a desired longitudinal sound conductivity resistance. In one embodiment, the frame 30 is 100 mm thick, the sheets of mineral wool 36 and 37 are each in one embodiment 40 mm, leaving an air gap 38 of 20 mm. The mineral wool sheets 36 and 37 may have a different density (i.e., a different sound absorption characteristic) than the sound insulation 24 in the framework 20. The mineral wool sheets 36 and 37 may themselves also have a different density relative to each other. Providing layers of insulation of like material but of different density has a similar effect as providing layers of insulation of different materials in accordance with the present invention. The insulation layers differing in either density or material absorb and attenuate sound differently.

In this embodiment, a third air gap 40 resides between the mineral wool sheet 37 and the inner plasterboard layers 34 of the wall 18. Another mineral wool sheet 42 resides inside the inner plasterboard sheets 34 and outside of the RF shielding 26. The mineral wool sheet 42 may be adapted to completely fill the void between the wall 18 and the RF shielding 26 or a further air gap may be defined between the sheet 42 and either the RF shielding 26 or the wall 18.

The wall of the enclosure 10 as illustrated in FIG. 1 includes multiple layers of different materials of insulation having different sound absorption characteristics disposed around multiple air gaps. The combination of the different layers and air gaps create a torturous path for sound waves to travel and multiple different ways to absorb or disperse the different components or frequencies of the sound waves, which make up the noise generated by the MRI equipment.

Disposing the various layers of insulation having different noise absorption, attenuation and insulating characteristics as described above attenuates and absorbs sound or noise from the MRI equipment more efficiently and more effectively than by simply: (i) providing one solid block of insulation of the same thickness; (ii) providing multiple layers of insulation without air gaps; and (iii) providing multiple layers of the same insulating material. Additionally, using the structure of the building to provide one or more insulation layers which co-act with the insulating layers of the rest of the enclosure increases the noise absorption, attenuation and insulation of the entire enclosure. Additionally as discussed below, by providing for absorption of the vibration and related noise of the MRI equipment, the noise attenuation of the RF enclosure is substantially increased over known RF enclosures.

In one embodiment of the present invention, the ceiling 14 of the enclosure 10 makes use of the existing building structure 12. A mineral wool sheet 44 that is in one embodiment a 60 mm thick sheet of Rockwool having a longitudinal sound conductivity resistance of at least 10 kP s/m$^2$ resides below the ceiling 14. The ceiling 14 and the sheet 44 define an upper air gap 66. The mineral wool sheet 44 sits above the framework 20 and the RF shielding 26 which is attached to the framework 20. The RF shielding 26 of the ceiling or the enclosure 10 preferably electrically couples to the shielding 26 of the walls of the enclosure 10.

As illustrated, metal fasteners 46 in one embodiment are used to bolt the studs and legs 21 of the framework 20 together. In a preferred embodiment, however, shielded or dampened fasteners 48 are used when the fastener extends outwardly through a layer of insulation. In this case, the elastic fastener 48 extends outwardly through the mineral wool sheet 44. This is contrasted with the metal fasteners 46 which do not extend outwardly through a layer of insulation, but which at most may be covered up by sound insulation such as the sound insulation 24. The elastic fastener 48 in one embodiment includes heavy springs (illustrated in FIG. 1). In another embodiment, the elastic fastener 48 includes rubber separation layers, i.e., elastic fixation.

The ceiling of the enclosure 10 like the enclosure wall includes a finishing layer 50, which in one embodiment is a perforated acoustical ceiling as is known to those of skill in the art. The acoustical ceiling 50 defines holes or aperatures that enable downlighting 52 to extend from the inside of the enclosure 10 up into the soundproofed ceiling. The acoustical ceiling 50 has a different noise insulation characteristic than does the mineral wool sheet 44. The combination of insulating layers having different sound absorbing characteristics and air gaps provides the same level of efficient and effective sound insulation as described above with respect to the wall of the enclosure 10.

In one embodiment, the floor of the enclosure rests on the floor or substrate 16 of the building 12. In general, the floor acts as a bed for the copper shield of the Faraday cage. The floor insulates electrically from ground and provides a base for laying a floor covering. In one embodiment, a layer of electrical insulation 54 rests on top of the floor 16 of the building 12. A layer of hard fiberboard or masonite 56 rests on top of the electrical insulation layer 54. A layer of RF shielding 58 is disposed on top of the hard fiberboard or masonite 56. The layer of copper shielding 58 in one embodiment includes overlapping copper foil sheets that are soldered together to form a single uninterrupted copper surface. In one embodiment, the RF shielding 58 is soldered to or otherwise electrically connects to the RF shielding 26 of the walls and ceiling of the enclosure 10.

A chipboard or particleboard core sheet 60 which in one embodiment is 16 mm thick rests on top of the RF shielding. Chipboard is also commonly referred to as particleboard core or simply particleboard. The sheet 60 in one embodiment is high density chipboard. Above the high density chipboard layer 60 resides a top layer of hard fiberboard or masonite 62. The hard fiberboard or masonite 62 and the high density chipboard layer 60 protect the shielding and provide a base for a floor covering 64. The floor covering 64 may be any suitable tile or other surface upon which operators and patients may walk.

The enclosure 10 of FIG. 1 generally provides 60 dB of soundproofing if the existing building has a requisite level of soundproofing. Typically, building codes require that building walls have a level of soundproofing greater than 53 decibels ("dB") and that building ceilings and floors have a level of soundproofing greater than 54 dB. If the building in which the enclosure 10 resides meets these requirements, then the enclosure 10 generally will provide a level of soundproofing greater than 60 dB. It should also be appreciated that heavy materials such as lead based materials attenuate very well in the low frequency range. Light and soft materials attenuate well in the higher frequency range. To attenuate this wide frequency range, different materials with different attenuation characteristics in combination with proper spacing and proper air gaps are preferably employed. The enclosures of the present invention generally seek to attenuate frequencies in the range of 10 Hz to 4000 Hz.

Each type of insulation attenuates differently at different frequencies. A 22 mm thick layer of a certain soft type of chipboard or particleboard for example attenuates approximately 10 to 30 dB of sound at about 125 Hz. As the frequency increases, the attenuation increases and peaks at about 1000 Hz, wherein the chipboard or particleboard attenuates about 30 to 40 dB's of sound. If a 50 mm layer of mineral wool spaced apart from the particleboard layer by an air gap is added and a second layer of particleboard 12 mm thick particleboard spaced apart from the mineral wool layer by a second air gap is added, the attenuation jumps to about 33 dB at 125 Hz and up to about 65 dB at 1000 Hz. The attenuation achieved by the varying types of insulation and the air gaps exceeds that which could be achieved by a like overall thickness of a single type of sound insulation.

Figure 2:
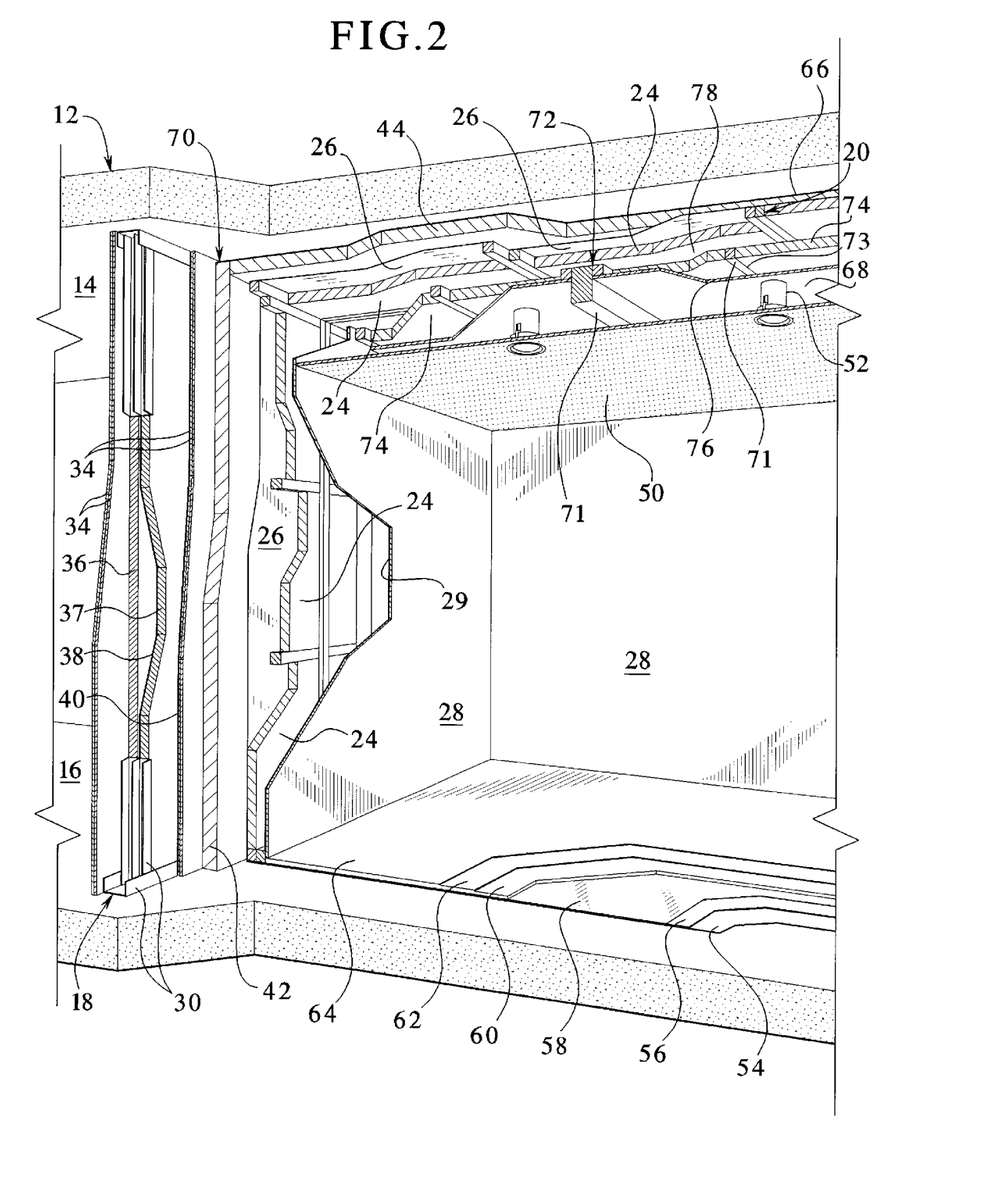
FIG. 2 is a fragmentary perspective view of another embodiment of an acoustically insulated and RF shielded enclosure of the present invention that provides greater acoustic insulation than the embodiment of FIG. 1.

Referring now to FIG. 2, an alternative enclosure 70 is illustrated. The enclosure 70 is adapted to provide at least 65 dB of sound insulation if the building 12 meets the code requirements, namely, that the building wall 18 provides at least 53 dB of sound insulation and that the ceiling 14 and floors 16 of the building provide at least 54 dB. The wall of the enclosure 70 is generally the same as the wall of the enclosure 10. That is, the wall of the enclosure 70 includes the framework 20 having the sound insulation 24 and the RF shielding 26. The wall includes the outer framework 30 having the layers of mineral wool 36 and 37 and the outer plasterboard sheets 34. The wall of the enclosure 70 further includes the mineral wool layer 42 between the inner plasterboard sheets 34 and the conductive sheet 26. The wall also includes the finishing wall or barrier 28 and each of the gaps 29, 38 and 40 described above.

The floor of the enclosure 70 is also generally the same as the floor of the enclosure 10. That is, the floor of the enclosure 70 includes the electrical insulation layer 54, the hard fiberboard or masonite layer 56, the copper RF shielding 58, the chipboard layer 60, the hard fiberboard or masonite layer 62 and the floor surfacing or floor covering 64. The enclosure 70 obtains the additional 5 dB of soundproofing by adding additional layers of sound wave insulation to the ceiling of the enclosure and thereby forming additional air gaps in the ceiling. The ceiling of the enclosure 70 includes the same components as the ceiling of the enclosure 10. That is, the ceiling of the enclosure 70 includes the framework 20 defining the insulation filled cavities 22 and having the outer RF shielding layer 26. The ceiling also includes the mineral wool layer 44 as well as the upper air gap 66 and the lower air gap 68. The ceiling further includes the acoustical ceiling 50 and the lighting 52.

In addition, the ceiling of the enclosure 70 includes a second framework 72 having a plurality of legs and struts 71 that define cavities 73. In one embodiment, mineral wool sheets 74 of 40 mm thickness fill the cavities 73. A chipboard layer 76 having a thickness of 16 mm in one embodiment resides beneath the cavities 73 and the insulation 74 of the second framework 72. The second framework 72 enables a third or middle air gap 78 to extend between the framework 72 and the framework 20. The second framework 72 could alternatively include the shielding 26.

It should be appreciated therefore that the ceiling of the enclosure 70 provides at least three different types or layers of insulation having different sound absorption characteristics. The acoustic wall 50 provides one type of insulation having one sound absorption characteristic. The chipboard sheet 76 provides a second type of insulation having another sound absorption characteristic. The layers 44, 24 and 74 of mineral wool or Rockwool provide at least a third type of insulation having yet another sound absorption characteristic. If any of the layers of mineral wool are of a different density than the other of such layers, then the ceiling of the enclosure 70 includes more than three different types of layers of insulation having more than three different types of sound absorbing characteristics.

The ceiling also includes three separate air gaps having different sound absorbing characteristics and the conductive shield. The additional layers of different insulation and air gaps enable the enclosure 70 to achieve at least 65 dB of sound insulation assuming that the building meets the code standards. The present invention provides higher levels of noise insulation than is known in the prior art by providing different layers of noise insulation which absorb different components or frequencies of the sound waves of the noise generated by the MRI equipment in the enclosure.

Figure 3:
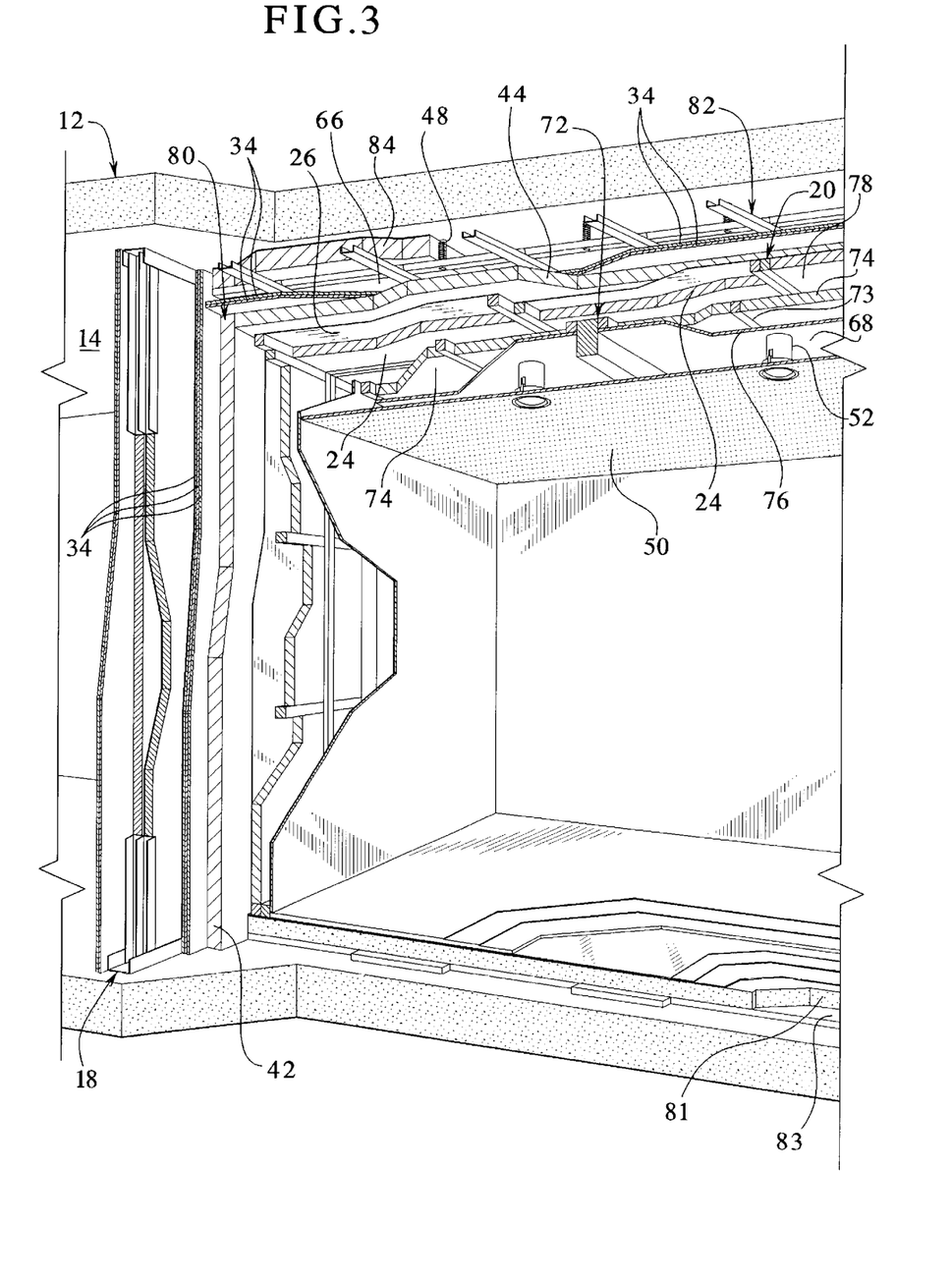
FIG. 3 is a fragmentary perspective view of a further embodiment of an acoustically insulated and RF shielded enclosure of the present invention that provides greater acoustic insulation than the embodiment of FIG. 2.

Referring now to FIG. 3, a further enclosure 80 of the present invention is illustrated. The enclosure 80 provides at least 73 dB of soundproofing assuming that the building meets the code standards. The enclosure 80 utilizes the existing soundproofing of the building 12. The wall of the enclosure 80 includes each of the components described above in connection with the enclosure 10 and the enclosure 70 of FIGS. 1 and 3, respectively. The wall of the enclosure 80 includes an additional plasterboard sheet 34 between the wall 18 of the building 12 and the mineral wool layer 42. Additionally, the mineral wool layer 42 is thickened, e.g., to 80 mm. In a preferred embodiment, the mineral wool layer 42 still maintains a sound conductivity resistance of at least 10 kP S/m². Otherwise, the wall of the enclosure 80 is the same as the walls of the enclosures 10 and 70.

The floor of the enclosure 80 is substantially the same as the floor of the enclosures 10 and 70. The floor of the enclosure 80, however, additionally includes a heavy layer 81 of approximately 80 mm thickness on top of an elastomer layer 83 of approximately 25 mm to 50 mm thickness. In one embodiment, layer 81 is concrete. In another embodiment, layer 81 is one or more layers of a high-density water resistant, tongue and grooved chipboard. The elastomer layer is recommended for the MRI equipment so as to enable the floor to attenuate sound waves created by the equipment. The elastomer 83 may be any type of elastomer layer known to those of skill in the art. The elastomer layer in one embodiment is formed from rubber, such as natural or synthetic rubber, polyurethenes, silicone rubbers, Viton™, Kalrez™, neoprene or Zalak™. The heavy concrete slab 81 sits atop the elastomer 83. The remainder of the flooring, which is the same as that discussed above, resides on top of the concrete slab 81.

As with the enclosure 70, the enclosure 80 obtains the additional soundproofing primarily by adding layers of different sound wave absorbing insulation and air gaps to the ceiling. The ceiling of the enclosure 80 includes each of the components of the enclosure 70 as well as additional components. The ceiling of the enclosure 80 includes the framework 20 defining the cavities that are filled by the insulation 24. The ceiling also includes the second framework 72 having the cavities 73, the sound insulation 74 and the chipboard layer 76. The second framework 72 could alternatively include the shielding 26. The ceiling also includes the acoustical top wall 50 and the lighting 52. The ceiling of the enclosure 80 also defines the upper air gap 66, the lower air gap 68 and the middle air gap 78.

Additionally, the ceiling of the enclosure 80 includes a third framework 82. The third framework 82 is, in one embodiment, part of the existing building 12. The framework 82 as illustrated is metallic and is separated from the mineral wool layer 44 by two plasterboard sheets 34. The third framework 82 secures to the ceiling 14 of the building 12 via the elastic fasteners 48 described above. An additional layer of mineral wool 84 resides between the third framework 82 and the ceiling 14 of the building 12. In one embodiment, the mineral wool layer 84 is Rockwool having a thickness of 80 mm. The upper air gap 66 of, e.g., 20 mm thickness is defined by the cavities created by the third framework 82, wherein the studs 85 of the framework are not filled in with insulation.

It should thus be appreciated that the additional decibels of sound insulation are again obtained primarily by the additional framework 82 in the ceiling, which provides more opportunities for additional layers of different insulation to absorb different components or frequencies of the sound waves and maintains or increases the number of possible air gaps. The ceiling of the enclosure 80 includes at least four different types of insulation. That is, the ceiling of the enclosure 80 includes the acoustic top wall 50, the chipboard 76, multiple layers of mineral wool and a plurality of layers of plasterboard 34. If the mineral wool layers have varying densities, then the number of different types of insulation having different sound absorbing characteristics increases further. The combination of differing layers of insulation and the plurality of air gaps between these different layers as well as the existing soundproofing of the building 12 enable the enclosure 80 to achieve at least 73 dB of sound insulation assuming the code standards of the building 12 are met.

Figure 4:
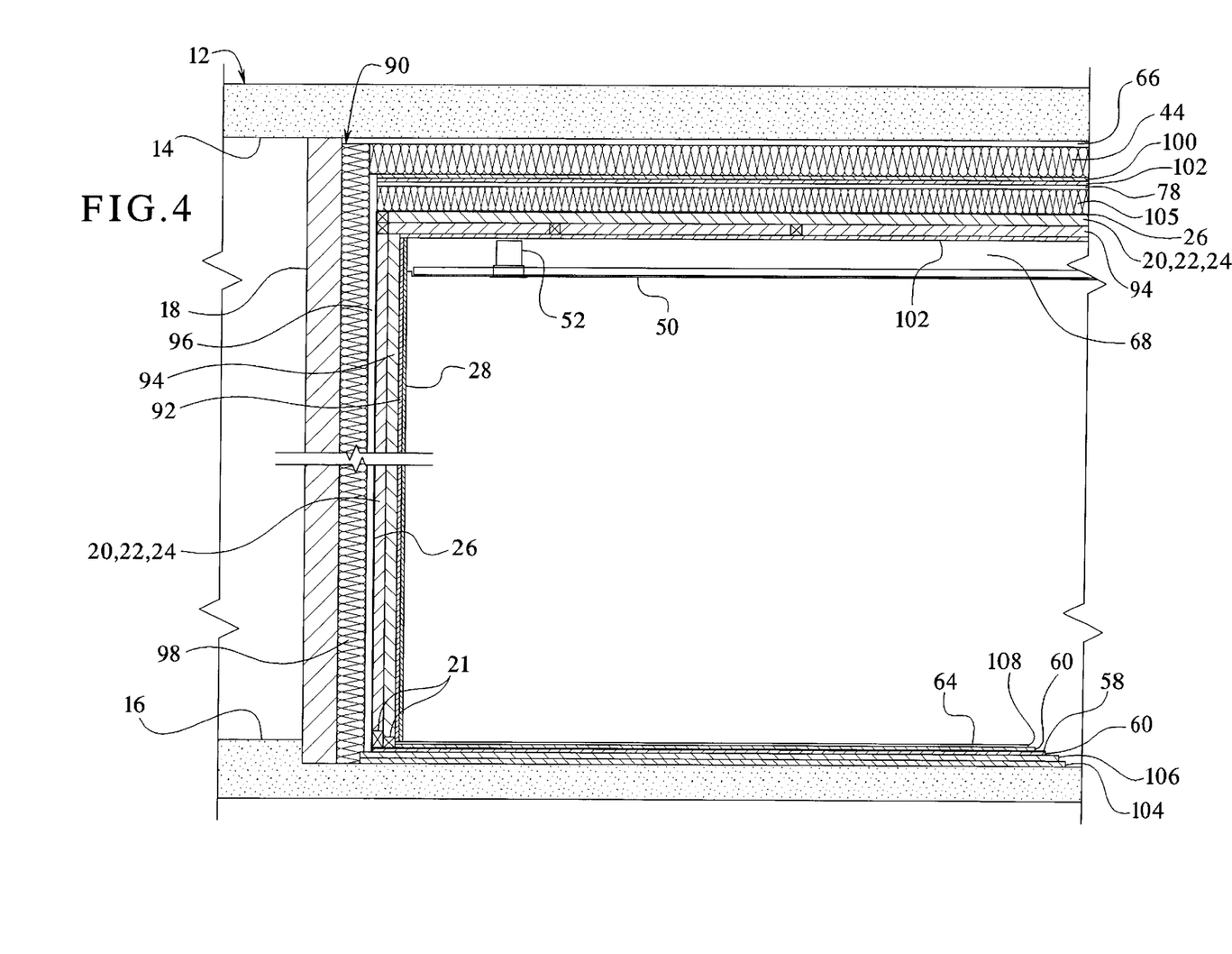
FIG. 4 is a fragmentary cross-sectional view of a further embodiment of an acoustically insulated and RF shielded enclosure of the present invention.

Referring now to FIG. 4, another alternative enclosure 90 is illustrated. The enclosure 90 resides inside of the building 12. The building 12 includes the ceiling 14, the floor 16 and the wall 18.

In the enclosure 90, the wall 18 provides acoustic insulation or attenuation, however, layers of insulation are not placed inside the wall 18 of the building. Rather, the wall 18 defines the outer layer of insulation of the enclosure 90. A mineral wool sheet 98 of, e.g., 120 mm thickness, resides inside the wall 18. The framework 20 having the cavities 22, the sound insulation 24 and the copper shielding 26 resides inside the mineral wool sheet 98. The mineral wool sheet 98 and the framework 20 define an air gap 96. A mineral wool sheet 94 is disposed within the timber furrings or cavity of the second thickness of the legs or struts 21 of the framework 20. A chipboard sheet 92 of approximately 22 mm thickness in one embodiment resides inside of the framework 20 and the dual layers of mineral wool 24 and 94 within the framework 20. The finishing wall 28 resides inside the chipboard layer 92.

The wall of the enclosure 90 therefore differs primarily from the other enclosures in that the building wall is not impregnated with further layers of insulation. Also, the framework 20 having the two layers of struts or legs 21 fills both layers with mineral wool. The wall of the enclosure 90 includes an air gap 96 and various layers of different types of insulation.

The floor of the enclosure 90 rests in a crevice or cavity defined by the preferably concrete floor 16. A vibration isolation pad 104 rests on the concrete floor 16. The vibration isolation pad 104 in one embodiment is a foam polyurethane product. The vibration isolation pad 104 is a type of elastomer member that suitably supports the MRI equipment or sound emitting device.

A chipboard sheet 106 of, e.g., 25 mm thickness rests on top of the vibration isolation pad 104. A first chipboard sheet 60 of 16 mm thickness rests on the chipboard sheet 106. The copper RF shielding 58 rests on the first chipboard sheet 60. A second chipboard sheet 60 of approximately 16 mm rests on the RF shielding 58. A layer of hard fiberboard or masonite 108 resides above the second chipboard sheet 60. Finally, the floor surfacing or floor covering 64 rests on the hard fiberboard or masonite 108. The hard fiberboard or masonite 108 in one embodiment is approximately 6 mm thick and serves to provide a hard solid surface for the floor covering 64, which in one embodiment is approximately 2 mm thick.

The ceiling of the enclosure 90 incorporates the ceiling 14 of the building 12. A mineral wool layer 44 of approximately 120 mm resides below the ceiling 14 of the building 12. The upper air gap 66 exists between the ceiling 14 and the mineral wool layer 44. A first chipboard sheet 100 of approximately 22 mm thickness and a second chipboard sheet 102 of approximately 16 mm thickness resides below the mineral wool sheet 44.

The framework 20 having the cavities 22 and the insulation 24 filling the cavities 22 is positioned beneath the chipboard layers 100 and 102. The RF shielding 26 is attached atop the framework 20. A layer of insulation 105 resides above the RF shielding 26. The insulation layer 105 in one embodiment includes timber beams and Rockwool having a density of 32 kg/m³. The insulation layer 105 and the lower chipboard sheet 102 define the middle air gap 78.

The mineral wool layer 94 of approximately 40 mm thickness resides within the inner legs and struts 21 of the framework 20. A chipboard sheet 102 is attached below the insulation layer 94. The finishing wall or acoustic ceiling 50 sits beneath the chipboard layer 102 a distance sufficient to allow the lighting 52 to mount to the acoustic ceiling 50. The lower air gap 68 resides between the acoustic ceiling 50 and the chipboard sheet 102.

Figure 5:
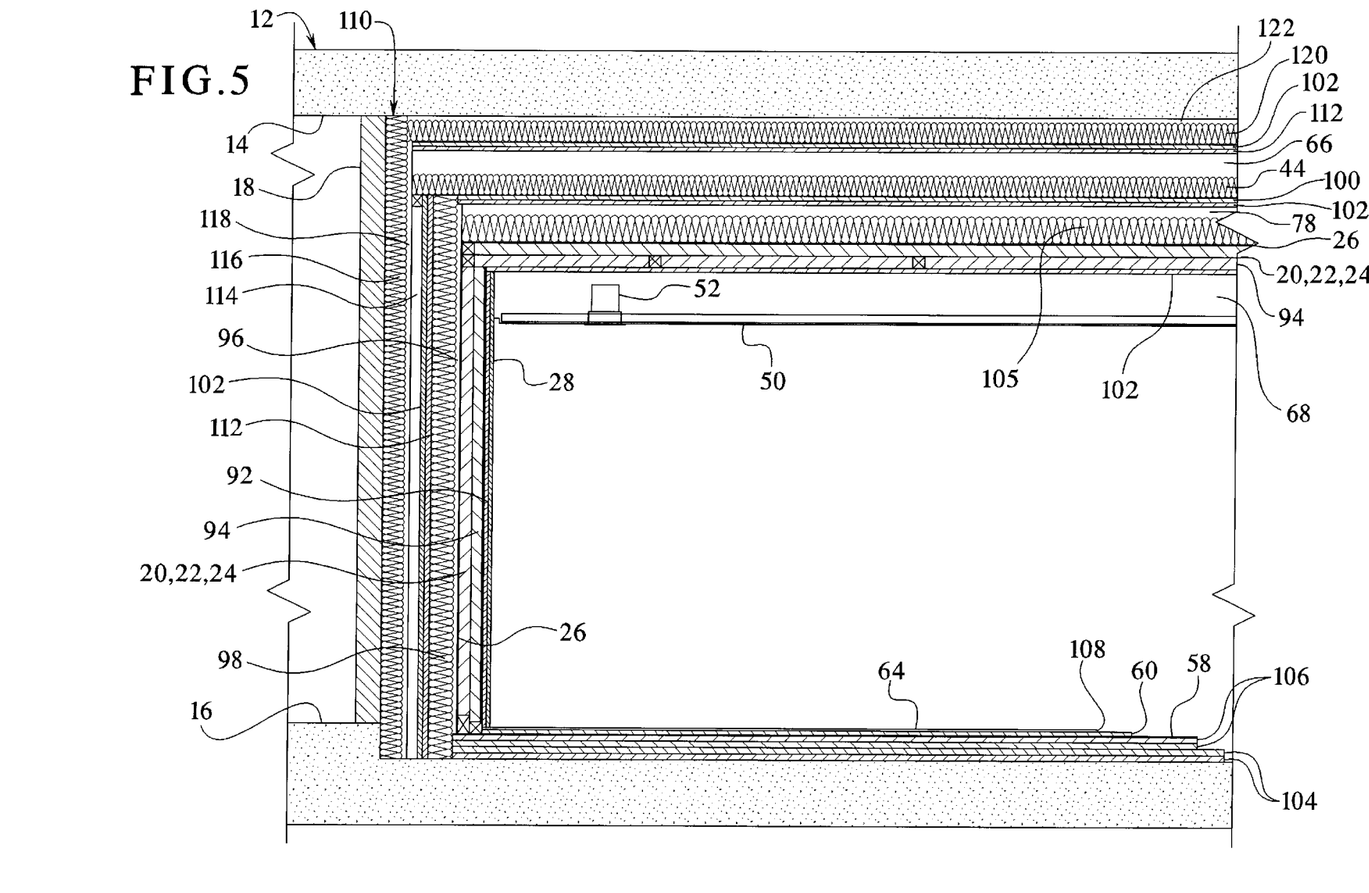
FIG. 5 is a fragmentary cross-sectional view of a further embodiment of an acoustically insulated and RF shielded enclosure of the present invention.

Referring now to FIG. 5, a further enclosure 110 is illustrated. The wall of the enclosure 110 includes each of the components of the wall of the enclosure 90, namely: the framework 20 having the cavities 22, the insulation 24 and the mineral wool layer 94; the chipboard layer 92 and the finishing wall 28 disposed inside of the framework 20; and the RF shielding 26, the air gap 96, the mineral wool layer 98 and the concrete wall 18 disposed outside of the framework 20. Additionally, the wall of the enclosure 110 includes a chipboard layer 102 of approximately 16 mm thickness and a chipboard sheet 112 of approximately 19 mm thickness disposed outside of the mineral wool sheet 98, which is approximately 120 mm thick. The wall of the enclosure 110 also includes a second timber framework 114 having legs and struts of approximately 45 mm in thickness. The second framework 114 resides outside of the sheets 102 and 112. Another mineral wool sheet 116 in one embodiment has a 100 mm thickness and sits directly inside the concrete wall 18 of the building 12. The mineral wool layer 116 and the second timber framework 114 define an additional air gap 118.

The floor of the enclosure 110 is similar to the floor of the enclosure 90. However, the floor of the enclosure 110 includes two vibration isolation layers 104. As before, the isolation layers 104 in one embodiment are a foam polyurethane. The floor of the enclosure 110 also includes two chipboard sheet layers 106, each of approximately 25 mm thickness. The RF shielding layer 58 rests on the upper chipboard layer 106. The chipboard sheet 60 of approximately 16 mm thickness sits above the RF shielding layer 58. The hard fiberboard or masonite layer 108 of approximately 6 mm thickness sits atop the chipboard sheet 60. The floor finishing or covering layer 64 resides atop the hard fiberboard or masonite layer 108.

The ceiling of the enclosure 110 includes each of the components of the enclosure 90, namely: the framework 20 having the cavities 22, the insulation 24 and the second layer of insulation 94; the chipboard layer 102, the acoustic ceiling 50, the lighting 52 and lower air gap 68 disposed beneath the framework 20; and the RF shielding layer 26, the insulation layer 105, the middle air gap 78, the chipboard layers 100 and 102, the mineral wool layer 44 and the upper air gap 66 disposed above the framework 20. Additionally, the ceiling of the enclosure 110 includes an additional chipboard sheet 112 of approximately 19 mm thickness and an additional chipboard sheet 102 of approximately 16 mm thickness. The additional sheets 112 and 102 rest above the upper air gap 66. An additional mineral wool sheet 120 of approximately 80 mm thickness resides above the sheet 102. The additional mineral wool sheet 120 and the concrete ceiling 14 of the building 12 define an additional upper air gap 122.

As described above, the enclosures 90 and 110 include a variety of different types of insulation as well as at least one air gap in the walls and ceilings. The different types of insulation are placed side by side so that the sound waves created inside of the enclosures must take a torturous path in order to escape from the enclosures. The air gaps are positioned so that the sound spreads out or disperses within the air gap before encountering another layer of insulation having a different sound absorbing characteristic. Alternatively, the air gaps are filled with mineral wool. In one preferred embodiment, the total gap includes approximately two thirds mineral wool and approximately one third air.

Figure 6:
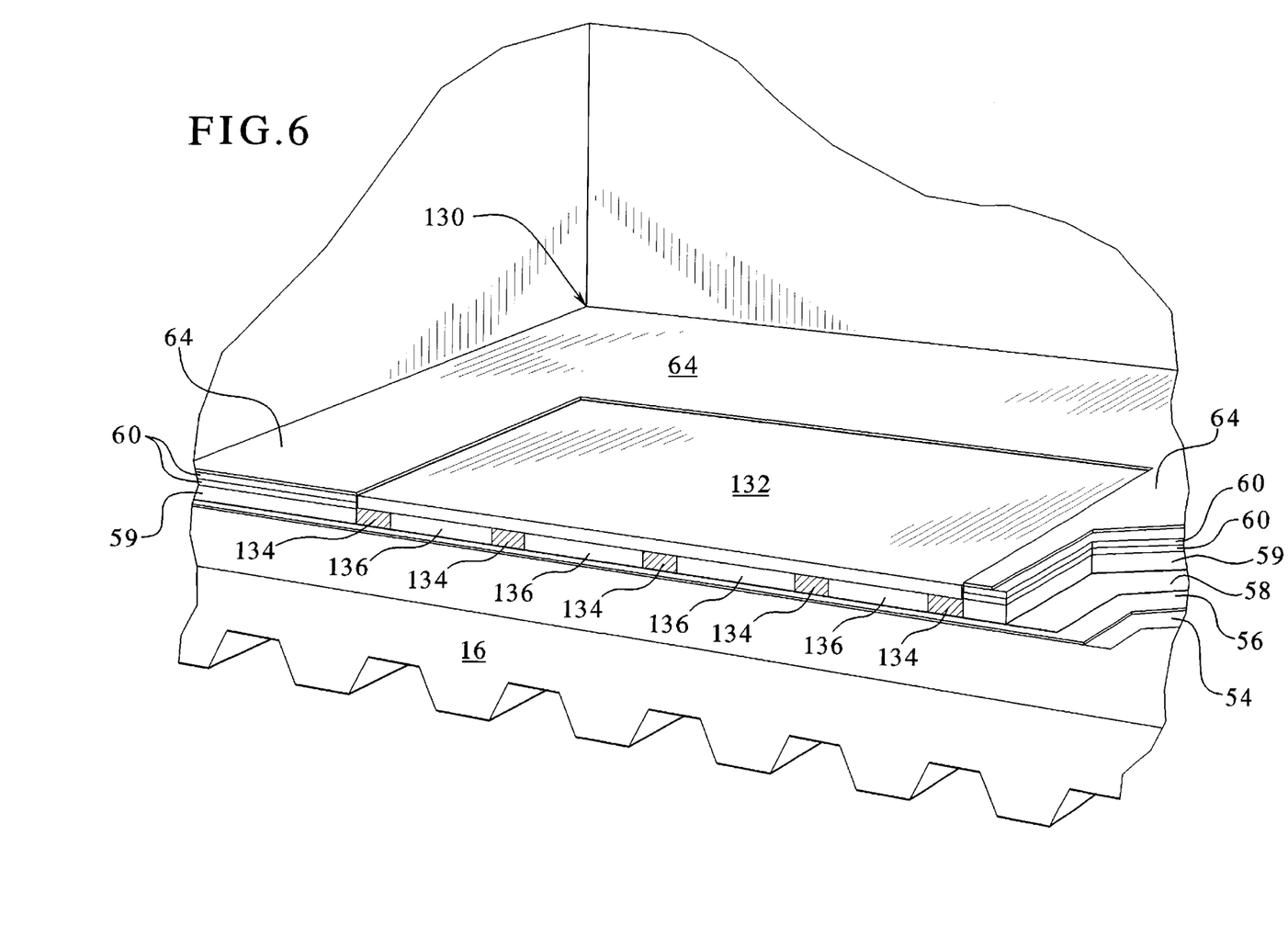
FIG. 6 is a fragmentary perspective view of one embodiment of a floor of the enclosure present invention that attenuates vibration and noise of the equipment in the enclosure.

Referring now to FIG. 6, one alternative embodiment of a floor 130 of the present invention is illustrated. The enclosures 90 and 110 as well as the enclosure 80 of FIG. 3 each include a floor having a flexible layer or a vibration isolation layer. In certain instances, it is desirable to add mass or weight to the floor directly beneath the MRI equipment and above the elastomeric member or vibration isolation devices. In this embodiment, the floor 130 includes a non-magnetic weighted support or plate such as a 5 cm (2 inches) thick stainless steel plate 132 positioned directly underneath the MRI equipment which adds approximately 1134 kg (2500 pounds) of weight to the floor. The weight of the plate will change depending on the weight of the MRI equipment, that is, the heavier the equipment, the heavier the plate.

The weighted plate 132 is preferably non-magnetic and is not able to be magnetized. That is, it contains a low amount or no amount of carbon. A low carbon stainless steel, such as Stainless Steel 304 or Stainless Steel 318, is therefore preferred. It should be appreciated, however, that any dense, non-magnetic material that is able to provide sufficient weight to the floor 130 may be used.

The floor 130 has two sections. The first section is defined by the dimensions of the weighted plate 132. The stainless steel plate 132 is in one embodiment 190.5 cm (75 inches) by 190.5 cm (75 inches) along its top area. The plate 132 can be of a constant thickness. The thickness of the plate 132 may alternatively increase (e.g., around feet or mounts of the equipment) or decrease in certain parts depending on the loading of the MRI equipment. The thickness of the plate can for instance vary from about 3.8 cm (1½ inches) to about 5 cm (2 inches), although thicker and thinner dimensions are possible.

The thickness of the plate 132 depends on the length and width of the plate, i.e., the larger the plate, the less the thickness for a given mass. Thinner plates, however, may need to be reinforced or have thicker areas in certain areas to support the MRI equipment. The thickness or size of the plate 132 depends on the mass needed to dampen the vibration of the MRI equipment, the mass needed to support the MRI equipment, the load bearing capabilities of the building or floor in which the enclosure resides and the density of the metal or heavy material.

The stainless steel plate 132 preferably sits atop a plurality of elongated elastomeric vibration dampening members 134 and mineral wool 136 or other supporting section. The elastomeric members 134 are any suitable type of elastomer or vibration absorbing material, such as those listed above. In one preferred embodiment, the elastomeric members 134 include a material known as Sylomer®, which is available in different densities, thicknesses and dimensions. Sylomer® can be obtained in 12 mm (½ inch) thickness and 25 mm (1 inch) thickness, having a density of 680 kg/m³. In other embodiments, the elastomeric members 134 are rubber products such as natural or synthetic rubber, polyurethane, silicone rubbers, Viton™, Kalrez™, neoprene or Zalak™. The mineral wool 136 is also preferably compressible.

The heavy metal sheet 132 and elastomeric members co-act to reduce the vibration and relative structural noise due to the MRI or other noise producing equipment, which the equipment transmits into the floor, through the structure of the building and into other rooms of said building. The mounting thus reduces the airborne noise caused by the vibration. The elasticity of the mounting determines its natural frequency ($f_0$). The mounting can only transmit frequencies below its natural frequency ($f_0$). The mounting attenuates all frequencies above a frequency equal to $2^5 \times f_0$.

The entire floor includes the electrical insulation layer 54 and the hard fiberboard or masonite layer 56 and the RF shielding layer 58 above the insulation layer 54. In the first section of the floor 130, the elastomeric members 134, and in one embodiment mineral wool 136 between the elastomeric members 134, each sit atop the RF shielding layer 58. In another embodiment, only the elastomeric members 134 are employed. In further embodiments, one or more layers of sound insulation can separate the members 134 and 136 from the shielding layer 58. The stainless steel plate sits atop the elastomeric members 134 and 136.

The other section of the floor 130 is the area around the stainless steel plate 132. In a preferred embodiment, an air gap of approximately 3 mm (⅛ inch) exists between the non-magnetic plate 132 and the section of the floor 130 around the plate 132. The slight air gap assures that the vibrations of the plate 132 do not transfer to the section of the floor around the plate 132 and vice-versa. That is, it is important to isolate the two sections, so that both may dampen the respective vibrations individually.

In the area around the plate, a relatively thick elastic layer 59 resides on top of the shielding 58. The elastic layer 59 in one embodiment is mineral wool and in another embodiment is any of the types of rubber listed above. In either case the layer 59, of a different type of insulation than the layers 60, aids in attenuating airborne noise. The layer 59 also floats above the shielding 58 in a preferred embodiment. The layer 59 in one embodiment is 52 to 65 mm (2 to 2.5 inches) in thickness. Two chipboard or particleboard layers 60 each of approximately 16 mm (⅝ inches) in thickness sit atop the elastomer or mineral wool layer 59. The two chipboard layers 60 (total 32 mm or 1.25 inches) may be of the same or different thickness and of the same or different density.

The two sections of the floor 130 preferably add to the same height above the shielding 58. The thickness of the elastomers 134 and mineral wool 136 of the first section and the elastomer or mineral wool layer 59 of the second section can vary slightly to accommodate varying widths of the plate 132. In an alternative embodiment, the non-magnetic plate 132 resides slightly above or slightly below the top chipboard layer 60. A floor covering 64 of approximately 3 mm (⅛ inch) thickness in the illustrated embodiment covers the top chipboard layer 60 extending around the plate 132. In another embodiment, separate sections of the floor covering 64 individually cover both sections of the floor 130. That is, one section of the floor covering 64 covers the heavy metal plate 132 and another section of the covering 64 covers the remainder of the floor around the plate 132.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A composite wall/ceiling for an acoustically insulated and radio frequency shielded enclosure comprising:
   a first layer of sound wave insulation;
   a second layer of sound wave insulation adjacent to the first layer;
   a sheet of conductive shielding attached to one of the first and second layers; and
   a third layer of sound wave insulation adjacent to the second layer, wherein at least two of the first, second and third layers are different types of sound wave insulation, wherein either the first and second layers of sound wave insulation or the second and third layers of sound wave insulation define an air gap disposed therebetween.

2. The composite wall/ceiling of claim 1, wherein the first and second layers are of different types of sound wave insulation.

3. The composite wall/ceiling of claim 1, wherein the first and third layers are of different types of sound wave insulation.

4. The composite wall/ceiling of claim 1, wherein the second and third layers are of different types of sound wave insulation.

5. The composite wall/ceiling of claim 1, wherein the first and second layers of sound wave insulation define a first air gap disposed therebetween and the second and third layers of sound wave insulation define a second air gap disposed therebetween.

6. The composite wall/ceiling of claim 1, wherein at least one of the first, second and third sound wave insulation layers is of a first type of mineral wool and at least one of the first, second and third sound wave insulation layers is of a second type of mineral wool having a different density than the first type of mineral wool.

7. A composite wall/ceiling for an acoustically insulated and radio frequency shielded enclosure comprising:
   a first layer including a first type of sound wave insulation;
   a second layer including the first type of sound wave insulation adjacent to the first layer;
   a sheet of conductive shielding attached to one of the first and second layers;
   a third layer including a second type of sound wave insulation adjacent to the second layer; and
   a fourth layer including the second type of sound wave insulation adjacent to the third layer, wherein an air gap is disposed between the first and second types of sound wave insulation.

8. The composite wall/ceiling of claim 7, which includes a second air gap disposed between either the first and second layers or the third and fourth layers.

9. A composite wall/ceiling for an acoustically insulated and radio frequency shielded enclosure comprising:
   a first layer including a first type of sound wave insulation;
   a second layer including a second type of sound wave insulation adjacent to the first layer;
   a sheet of conductive shielding attached to one of the first and second layers;
   a third layer including the first type of sound wave insulation adjacent to the second layer; and
   a fourth layer including the second type of sound wave insulation adjacent to the third layer, wherein an air gap is disposed between the first and second types of sound wave insulation.

10. The composite wall/ceiling of claim 9, wherein a portion of the air gap is partially filled with a fifth insulating material having a third type of sound wave insulation.

11. A composite wall/ceiling for an acoustically insulated and radio frequency shielded enclosure comprising:
    a framework defining at least one insulated cavity;
    a sheet of conductive shielding attached to the framework;
    a finishing barrier disposed inside of the framework, an inner surface of the finishing barrier visible from inside the enclosure;
    an outer barrier connected to a building that houses the enclosure, the outer barrier defining an insulated cavity, wherein at least one air gap extend between the framework and the outer barrier; and
    at least one layer of sound wave insulation disposed between the framework and the outer barrier.

12. The wall/ceiling of claim 11, wherein the sound wave insulation is mineral wool and the finishing barrier is drywall.

13. The wall/ceiling of claim 11, wherein the outer barrier includes at least one layer of drywall.

14. The wall/ceiling of claim 11, wherein the insulated cavities include mineral wool.

15. The wall/ceiling of claim 11, wherein the cavity defined by the framework includes a different type of sound wave insulation than the cavity defined by the outer barrier.

16. The wall/ceiling of claim 11, wherein at least one of the cavities includes a plurality of layers of sound wave insulation.

17. The wall/ceiling of claim 16, wherein the plurality of layers of sound wave insulation define at least one air gap.

18. The wall/ceiling of claim 11, wherein the outer barrier is connected to the building using elastic fasteners.

19. A composite wall/ceiling for an acoustically insulated and radio frequency shielded enclosure comprising:
    a framework defining at least one insulated cavity;
    a sheet of conductive shielding attached to the framework;
    a finishing barrier disposed inside of the framework, an inner surface of the finishing barrier visible from inside the enclosure, the finishing barrier and the framework disposed on either side of a first air gap;
    an outer barrier connected to a building that houses the enclosure, the outer barrier defining an insulated cavity, wherein at least one air gap extends between the framework and the outer barrier;
    a first layer of sound wave insulation disposed between the framework and the outer barrier; and
    a second layer of sound wave insulation disposed between the framework and the outer barrier, the sound wave insulation of the second layer being different than the sound wave insulation of the first layer.

20. The composite wall/ceiling of claim 19, wherein the sound wave insulation of the second layer is a different material than the sound wave insulation of the first layer.

21. The composite wall/ceiling of claim 19, wherein the sound wave insulation of the second layer has a different density than the sound wave insulation of the first layer.

22. The composite wall/ceiling of claim 19, which includes a third layer of sound wave insulation disposed between the framework and the outer barrier, the third layer of sound wave insulation being of a same type as one of the first and second layers.

23. The composite wall/ceiling of claim 22, which includes a fourth layer of sound wave insulation disposed between the framework and the outer barrier, the fourth layer of sound wave insulation being of a same type as one of the first and second layers.

24. A composite floor for an acoustically insulated and radio frequency shielded enclosure comprising:
    a sheet of conductive shielding; and
    a non-magnetic sheet elastically situated above the conductive shielding so that the non-magnetic sheet attenuates frequencies above a natural frequency ($f_0$) of the non-magnetic sheet with any load situated on the sheet according to an equation $2^5 \times f_0$.

25. The composite floor of claim 24, wherein the non-magnetic sheet is metal.

26. The composite floor of claim 24, wherein the conductive shielding is copper and the non-magnetic sheet is stainless steel.

27. The composite floor of claim 24, which includes a plurality of elastomeric strips disposed between the non-magnetic sheet and the conductive sheet.

28. The composite floor of claim 27, wherein the elastomeric strips are rubber.

29. The composite floor of claim 24, wherein only frequencies below the natural frequency are transmitted.

30. A composite floor for an acoustically insulated and radio frequency shielded enclosure comprising:

a sheet of conductive shielding;
    a non-magnetic sheet elastically supported above a first portion of the conductive shielding; and
    a layer of sound wave insulation applied to a second portion of the conductive shielding wherein the layer of sound wave insulation is elastically supported above the second portion of the conductive shielding.

31. The composite floor of claim 30, wherein the sound wave insulation abuts at least two sides of the non-magnetic sheet and the non-magnetic sheet supports a noise source housed within the enclosure.

32. The composite floor of claim 30, which includes a layer of electrical insulation below the conductive shielding.

33. The composite floor of claim 30, which includes a floor covering applied atop at least one of the portions.

\* \* \* \* \*

UNITED STATES PATENT AND TRADEMARK OFFICE
CERTIFICATE OF CORRECTION

PATENT NO. : 6,626,264 B1
DATED : September 30, 2003
INVENTOR(S) : Christen

It is certified that error appears in the above-identified patent and that said Letters Patent is hereby corrected as shown below:

<u>Title page,</u>
Item [73], Assignee, change "IGT, Reno, NV (US)" to -- IMEDCO AG, Hagendorf, Switzerland --.

<u>Column 16,</u>
Line 1, change "extend" to -- extends --.
Line 67, change "$2^5 \text{x } f_0$" to -- $2^{-5} \text{x } f_0$ --.

Signed and Sealed this

Sixth Day of July, 2004

JON W. DUDAS
*Acting Director of the United States Patent and Trademark Office*